US009558911B2

(12) United States Patent
Biberger et al.

(10) Patent No.: US 9,558,911 B2
(45) Date of Patent: Jan. 31, 2017

(54) METHOD FOR ANALYZING AND/OR PROCESSING AN OBJECT AS WELL AS A PARTICLE BEAM DEVICE FOR CARRYING OUT THE METHOD

(71) Applicant: Carl Zeiss Microscopy GmbH, Jena (DE)

(72) Inventors: Josef Biberger, Wildenberg (DE); Lorenz Lechner, Dublin, CA (US); Michal Postolski, Barlinek (PL); Ralph Pulwey, Aalen (DE); Marcin Janaszewski, Pebrenice (PL)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 14/449,441

(22) Filed: Aug. 1, 2014

(65) Prior Publication Data

US 2016/0035534 A1   Feb. 4, 2016

(51) Int. Cl.
*H01J 37/00* (2006.01)
*H01J 37/20* (2006.01)
(Continued)

(52) U.S. Cl.
CPC .............. *H01J 37/20* (2013.01); *H01J 37/147* (2013.01); *H01J 37/265* (2013.01); *H01J 37/304* (2013.01); *H01J 2237/30433* (2013.01)

(58) Field of Classification Search
CPC ......... H01J 37/20; H01J 37/265; H01J 37/147
(Continued)

(56) References Cited

U.S. PATENT DOCUMENTS 3,555,254 A   1/1971   Gerber
6,864,488 B2  3/2005   Muraki
(Continued)

FOREIGN PATENT DOCUMENTS

DE   10 2009 028 600 A1   3/2011
EP       0 353 585 A2      2/1990
JP       2006-147592 A     6/2006

OTHER PUBLICATIONS

Andreas Rampe, "Raith Software Reference Manual Version 5.0", 2007.

*Primary Examiner* — Michael Maskell
(74) *Attorney, Agent, or Firm* — Muirhead and Saturnelli, LLC

(57) ABSTRACT

The application relates to a method for analyzing, in particular for imaging, and/or processing of an object as well as a particle beam device for carrying out this method. In particular, the particle beam device of this application is an electron beam device and/or an ion beam device. The method in particular comprises the control unit providing a first control parameter, wherein a beam guiding unit is controlled using the first control parameter for guiding the particle beam and/or wherein a moving unit is controlled using the first control parameter for moving an object holder, correlating a position of the object holder in a second coordinate system to the object position on the surface of the object, identifying a first coordinate transformation between the first coordinate system and the second coordinate system, identifying an orientation position of a distinctive feature on the surface of the object and identifying first coordinates of the orientation position in the first coordinate system, the control unit providing a second control parameter, wherein the second control parameter is used for at least one of: controlling the beam guiding unit for guiding the particle beam, controlling the moving unit for moving the
(Continued)

object holder or controlling a detector, identifying again the orientation position of the distinctive feature and identifying second coordinates of the orientation position in the first coordinate system, comparing the first coordinates with the second coordinates, identifying a local displacement of the first coordinates to the second coordinates, identifying a second coordinate transformation using the first coordinate transformation and the local displacement and identifying a position of an area to be analyzed and/or processed on the surface of the object.

28 Claims, 8 Drawing Sheets

(51) Int. Cl.
 *H01J 37/26* (2006.01)
 *H01J 37/147* (2006.01)
 *H01J 37/304* (2006.01)

(58) Field of Classification Search
 USPC .............................. 250/306, 307, 310, 311
 See application file for complete search history.

(56) References Cited

U.S. PATENT DOCUMENTS

| | | |
|---|---|---|
| 2005/0211929 A1 | 9/2005 | Kurokawa |
| 2006/0091321 A1 | 5/2006 | Kaga et al. |
| 2006/0192118 A1 | 8/2006 | Tashiro et al. |
| 2006/0219953 A1 | 10/2006 | Carleson |
| 2009/0039285 A1 | 2/2009 | Cooper |
| 2011/0133066 A1 | 6/2011 | Nozoe et al. |

METHOD FOR ANALYZING AND/OR PROCESSING AN OBJECT AS WELL AS A PARTICLE BEAM DEVICE FOR CARRYING OUT THE METHOD

TECHNICAL FIELD

The application relates to a method for analyzing, in particular for imaging, and/or processing of an object as well as a particle beam device for carrying out this method. In particular, the particle beam device of this application is an electron beam device and/or an ion beam device.

BACKGROUND OF THE INVENTION

Particle beam devices are used for examining samples (hereinafter also called objects) in order to obtain insights with regard to the properties and behaviour of the samples under specific conditions. One of those particle beam devices is an electron beam device, in particular a scanning electron microscope (also known as SEM) or a transmission electron microscope (also known as TEM).

In the case of an SEM, an electron beam (hereinafter also called primary electron beam) is generated using a beam generator. The electrons of the primary electron beam are accelerated to a predeterminable energy and focused by a beam guiding system, in particular an objective lens, onto a sample to be analyzed (that is to say an object to be analyzed). A high-voltage source having a predeterminable acceleration voltage is used for acceleration purposes. Using a deflection unit, the primary electron beam is guided in a raster-type fashion over a surface of the sample to be analyzed. In this case, the electrons of the primary electron beam interact with the material of the sample to be analyzed. In particular, interaction particles and/or interaction radiation arise(s) as a consequence of the interaction. By way of example, electrons are emitted by the sample to be analyzed (so-called secondary electrons) and electrons of the primary electron beam are backscattered at the sample to be analyzed (so-called backscattered electrons). The secondary electrons and backscattered electrons are detected and used for image generation. An image of the sample to be analyzed is thus obtained.

Furthermore, it is known from the prior art to use combination devices for processing and/or for analyzing a sample, wherein both electrons and ions can be guided onto a sample to be processed and/or to be analyzed. By way of example, it is known for an SEM to be additionally equipped with an ion beam column. Using an ion beam generator arranged in the ion beam column, ions are generated which are used for processing a sample (for example for removing a layer of the sample or for applying material to the sample) or else for imaging. In this case, the SEM serves, in particular, for observing the processing, but also for further analysis of the processed or non-processed sample.

It is desirable to exactly identify, on the surface of the object, the position of the area(s) which is/are to be analyzed or processed. If the position is exactly known, the particle beam of a particle beam device can be guided to this position such that only this area or those areas are analyzed and/or processed. Additionally or alternatively it is known to position the object and, therefore, the area on the surface of the object to be analyzed and/or processed with the best possible precision in the particle beam device such that the particle beam can be guided to the area. It is known to arrange the object on an object holder which is also known as a stage. The object holder is transitionally movable in three directions which are oriented perpendicular to each other. Additionally, the object holder may be rotated around a first rotation axis and/or a second rotation axis, the axes being oriented perpendicular to each other.

For positioning the object holder and, therefore, also the object to be analyzed and/or processed, the object holder is moved in such a way that, for positioning the object to a specific position, the object holder is moved to a specific position which is given by coordinates of a coordinate system. It should be noticed that several coordinate systems in a particle beam device might be relevant for positioning the object, wherein the coordinate systems are related to each other. As a matter of fact, each assembly unit of a particle beam device has its own coordinate system. The object to be analyzed and/or processed also has its own coordinate system.

A specific position on the surface of the object to be analyzed and/or processed has first coordinates in the coordinate system of the object which correspond to second coordinates in the coordinate system of the object holder, wherein the first coordinates and the second coordinates do not have to be identical with respect to their absolute values. For adjusting to a specific position on the surface of the object, it is known to use a coordinate transformation with respect to the above mentioned two coordinate systems and/or further coordinate systems which might be relevant.

When adjusting the object to a specific position by using the object holder, errors might occur. Due to mechanical errors with respect to the object holder or with respect to the movable parts of the object holder and due to the weight of the object on the object holder, movements of the object holder might occur, which do not allow an accurate positioning of the object and/or guiding the particle beam to the object. It may not be possible to determine the values of such errors, for which reason they may be irreproducible. However, they should be considered when positioning the object.

An exposure method for drawing a pattern on a substrate using a charged particle beam device is known. The method includes a detection step of placing a calibration substrate having a plurality of marks on a stage and detecting positions of the plurality of marks by a first position detection section using a charged particle beam and by a second position detection section using light while adjusting a position of the stage, and a correction step of correcting a position where the charged particle beam is incident on the substrate on which the pattern is to be drawn, in accordance with the position of the stage on the basis of the difference between the results detected by the charged particle beam, on one hand, and by the light in the detection step, on the other hand.

It is referred in particular to references US 2009/0039285 A1 and U.S. Pat. No. 6,864,488 B2 as prior art.

A particle beam device providing a particle beam comprising charged particles may be operated using different beam parameters which influence the characteristics of the particle beam. Such beam parameters are, for example, an acceleration voltage influencing a landing energy of the charged particles, the landing energy being the energy which the charged particles have when impinging on the object, a beam current of the particle beam which impinges on the object and voltages of the electrode units used for deflecting and/or shaping the particle beam. Those parameters and further parameters not mentioned here may influence the particle beam.

As mentioned above, an image of a surface of an object may be obtained using a particle beam. The image may be used to identify an area of the surface which is going to be analyzed and/or processed. However, after having identified the area using first beam parameters characterizing a first operation mode of the particle beam device, it might be necessary to change the first beam parameters used for operating the particle beam device into second beam parameters characterizing a second operation mode. The second beam parameters are used to analyze and/or to process the identified area on the object. For example, a lower or higher beam current has to be chosen to achieve a specific effect on the area. Furthermore, the acceleration voltage may be varied to achieve a specific effect. However, it has been discovered that the image characteristics of the particle beam are often changed when varying the beam parameters. In particular, it may happen that a local displacement in the image may occur. In other words, the area on the surface of the object, which has been identified and is to be analyzed and/or processed, cannot be found at coordinates in the second operation mode of the particle beam device which coordinates were identified in the first operation mode of the particle beam device. If this local displacement is not considered, the particle beam of the particle beam device being in the second operation mode may be guided to an area which has not been identified before. Therefore, a wrong area on the surface of the object may be analyzed and/or processed. It may not be possible to determine the values of such local displacements, for which reasons they may be irreproducible. However, they should be taken into consideration.

Therefore, it is desirable to provide a method and a particle beam device for carrying out the method, which method and particle beam device allow for guiding a particle beam device to an identified area on the surface of an object, even if beam parameters of the particle beam device are varied.

SUMMARY OF THE INVENTION

According to the system described herein, a method for analyzing and/or processing an object using a particle beam device is provided, wherein a particle beam may be guided in a raster-type fashion over a surface on the object. The particle beam device comprises at least one movable object holder for arranging the object in the particle beam device. Moreover, the particle beam device comprises at least one moving unit for moving the object holder. For example, the object holder is movable in three directions being oriented perpendicular to each other. Moreover, the object holder may be rotated around a first rotation axis and/or around a second rotation axis. The first rotation axis and the second rotation axis may be oriented perpendicular to each other. The rotation of the object holder around the second rotation axis is also known as tilting the object holder. The rotation around the second axis may be used to tilt the object holder in such a way that a surface of the object may be perpendicularly arranged with respect to the particle beam or that the surface of the object and the particle beam include a given angle, for example in the range of 0° to 90°.

The particle beam device comprises at least one beam generator for generating a particle beam comprising charged particles. Furthermore, the particle beam device comprises at least one beam guiding unit for guiding the particle beam to the object. For example, the beam guiding unit may be an electrostatic unit and/or a magnetic unit. In one embodiment of the invention, the beam guiding unit may be an objective lens. The particle beam device also comprises at least one control unit for controlling the beam guiding unit and/or for controlling the moving unit for moving the object holder.

Therefore, the moving unit allows for positioning the object holder into a desired position. Furthermore, the particle beam device comprises at least one detector for detecting at least one of: interaction particles or interaction radiation which are generated when the particle beam impinges on the object. The interaction particles may be secondary particles, for example secondary electrons or secondary ions, and/or backscattered particles, for example backscattered electrons. The interaction radiation may be X-rays or cathodoluminescence light.

The method according to the invention comprises the step of providing a first control parameter by the control unit, wherein the beam guiding unit is controlled using the first control parameter for guiding the particle beam. Additionally or alternatively, the moving unit is controlled using the first control parameter for moving the object holder such that the object is positioned in the particle beam device. In other words, the first control parameter is provided for running the particle beam device in a first operation mode.

The method also comprises the step of identifying object coordinates of at least one registration position on a surface of the object in a first coordinate system. The first coordinate system may be the coordinate system of the object. In a further step, a position of the object holder in a second coordinate system is correlated to the registration position on the surface of the object, wherein the position of the object holder is given by holder coordinates in the second coordinate system. The second coordinate system may be the coordinate system of the object holder.

Identifying object coordinates in this specification means that the object coordinates are determined and stored in a memory, as well as made accessible for further evaluation and calculations.

The method according to the invention also comprises the step of identifying a first coordinate transformation between the first coordinate system and the second coordinate system using the object coordinates of the object position and the holder coordinates of the position of the object holder. This step is a calibration step of the first coordinate system to the second coordinate system. In other words, this step provides the coordinate transformation which describes the relation between the first coordinate system and the second coordinate system.

The method according to the invention also comprises the step of identifying a distinctive feature on the surface of the object. This distinctive feature on the surface of the object may be easy to identify in any operation mode of the particle beam device. In particular, the distinctive feature is chosen in such a way that the distinctive feature can be identified in an image using several different values of beam parameters used for controlling the particle beam device. For example, if the particle beam device comprises two beam columns, namely a first beam column using a first particle beam of first charged particles and a second beam column using a second particle beam of second charged particles (which will be described in detail further below), the distinctive feature may be chosen in such a way that—when changing from one operation mode using the first beam column to a further operation mode using the second beam column—the distinctive feature is identified in either one of the operation modes. In contrast to the distinctive feature, a non-distinctive feature may not be identified when changing from the one operation mode to the further operation mode since the contrast of the non-distinctive feature in the image of the object generated in the one operation mode and in the image of the object generated in the further operation mode may change such that the non-distinctive feature is visible in the one operation mode but not in the further operation mode. In a further embodiment of the invention it is alternatively or additionally provided that the distinctive feature may be identified even if the object holder is tilted from a first position having a first tilt angle to a second position having a second tilt angle. In one further embodiment, the distinctive feature may be identified in any tilting position of the object holder.

The method according to the invention also comprises the step of identifying first coordinates of the distinctive feature. Again, identifying first coordinates means that the first coordinates are determined and stored in a memory as well as made accessible for further evaluation and calculations.

Furthermore, the method according to the invention comprises the step of the control unit providing a second control parameter, wherein the second control parameter is used for at least one of: controlling the beam guiding unit for guiding the particle beam, controlling the moving unit for moving the object holder or controlling the detector. In other words, the second control parameter is provided for running the particle beam device in a second operation mode. The step of controlling the beam guiding unit may comprise the step of changing from the one operation mode using the first beam column to the further operation mode using the second beam column.

Furthermore, the method according to the invention comprises the step of identifying again the distinctive feature after the control unit has provided the second control parameter. Second coordinates of the distinctive feature in the first coordinate system are identified, determined, stored, as well as made accessible for further evaluation and calculations. Moreover, the first coordinates are compared with the second coordinates. A local displacement of the first coordinates to the second coordinates is identified if the first coordinates are not identical with the second coordinates.

The method according to the invention also comprises the step of identifying a second coordinate transformation using the first coordinate transformation and the local displacement. In other words, this step provides the coordinate transformation which describes the relation between the first coordinate system and the second coordinate system considering the local displacement which might occur using different beam parameters for operating the particle beam device.

The method according to the invention also comprises the step of identifying a position of an area to be analyzed and/or processed on the surface of the object and of guiding the particle beam and/or moving the object holder using the moving unit to the position of the area to be analyzed and/or processed. The step of analyzing may comprise the step of imaging the object. The position of the area to be analyzed and/or processed is determined based on input information in combination with the second coordinate transformation. The input information can be the before mentioned coordinates of the registration positions, but also can be provided otherwise as coordinate positions which are uniquely defined and known relative to the registration positions.

The method according to the invention allows for analyzing and/or processing an area of an object even if a local displacement of this area in the image occurs due to the use of different beam parameters and/or different operation modes, as described above and further below, and even if this area cannot be directly identified in an image recorded in the operating mode in which it will be analyzed and/or processed. The method according to the invention avoids analyzing and/or processing a wrong area.

One embodiment of the method according to the invention additionally or alternatively provides that a first marking on the surface of the object is used as the distinctive feature. For example, the distinctive feature may be a cross-like marking or any other distinctive feature on the surface of the object to be analyzed and/or processed. Additionally or alternatively it is provided that the first marking is processed in and/or on the surface of the object before identifying the object coordinates, for example by using an ion beam and/or a laser beam.

A further embodiment of the method according to the invention additionally or alternatively provides that further markings are used as distinctive features. Therefore, the method of the invention is not restricted to use of a single distinctive feature, but may use more than one distinctive feature. Using more than one distinctive feature or a distinctive feature with an extended area, tilts and rotations between the coordinate systems in the first and second mode of operation also can be determined with better accuracy. For example, a second marking on the surface of the object is used as a further distinctive feature. This distinctive feature also may be a cross-like marking or any other distinctive feature on the surface of the object to be analyzed and/or processed. The distinctive feature may be chosen as mentioned further above or further below. Additionally or alternatively it is provided that the second marking is processed in and/or on the surface of the object before identifying the object coordinates, for example by using an ion beam and/or a laser beam.

As mentioned above, an embodiment of the method according to the invention additionally or alternatively provides that the object coordinate system is used as the first coordinate system. Additionally or alternatively, the object holder coordinate system may be used as the second coordinate system.

A further embodiment of the method according to the invention additionally or alternatively provides that the first control parameter is chosen in such a way that the control unit controls providing a first excitation to the beam guiding unit. Additionally or alternatively the first control parameter is chosen in such a way that the control unit controls providing a first landing energy of the particle beam. In another embodiment of the method according to the invention, additionally or alternatively the first control parameter is chosen in such a way that the control unit controls applying a first beam current of the particle beam.

An embodiment of the method according to the invention additionally or alternatively provides that the second control parameter is chosen in such a way that the control unit controls providing a second excitation to the beam guiding unit. Additionally or alternatively, the second control parameter is chosen in such a way that the control unit controls providing a second landing energy of the particle beam. In another embodiment of the method according to the invention, the second control parameter is chosen in such a way that the control unit controls applying a second beam current of the particle beam.

In a further embodiment of the method according to the invention, the particle beam device additionally or alternatively comprises at least one first beam column and at least one second beam column. The first beam column comprises the beam generator being a first beam generator for generating the particle beam being a first particle beam having the charged particles being first charged particles and the beam guiding unit being a first beam guiding unit for guiding the first particle beam to the object. The second beam column comprises at least one second beam generator for generating a second particle beam comprising second charged particles and at least one second beam guiding unit for guiding the second particle beam to the object. The method according to the invention additionally or alternatively further comprises a step of operating the particle beam device using the first beam column or the second beam column. In other words, the operation mode of the particle beam device is switched from using the first beam column to using the second beam column. Alternatively, the operation mode of the particle beam device is switched from using the second beam column to using the first beam column. In one embodiment of the method according to the invention, the first control parameter or the second control parameter is chosen in such a way that the switch between the use of the first beam column and the use of the second beam column or vice versa is carried out.

In a further embodiment of the method according to the invention, the detector of the particle beam device is a first detector. Moreover, the particle beam device additionally or alternatively comprises at least one second detector for detecting at least one of: interaction particles or interaction radiation which are generated when the particle beam impinges on the object. The interaction particles may be secondary particles, for example secondary electrons or secondary ions, and/or backscattered particles, for example backscattered electrons. The interaction radiation may be X-rays or cathodoluminescence light. In this embodiment, the method according to the invention additionally or alternatively comprises a step of operating the particle beam device using the first detector or the second detector. In other words, the operation mode of the particle beam device is switched from using the first detector to using the second detector. Alternatively, the operation mode of the particle beam device is switched from using the second detector to using the first detector. In one embodiment of the method according to the invention, the first control parameter or the second control parameter is chosen in such a way that the switch between the use of the first detector and the use of the second detector or vice versa is carried out. In one embodiment of the method according to the invention, the second control parameter is chosen in such a way that both detectors are used in the particle beam device.

The system described herein also refers to a computer program product comprising a program code which may be loaded or is loaded into a processor and which, when being executed, controls a particle beam device in such a way that a method comprising at least one of the above mentioned or further below mentioned steps or a combination of at least two of the above mentioned or further below mentioned steps is carried out.

The system described herein also refers to a particle beam device comprising at least one movable object holder for arranging the object in the particle beam device, at least one moving unit for moving the object holder, at least one beam generator for generating a particle beam comprising charged particles, at least one beam guiding unit for guiding the particle beam to the object, at least one control unit for controlling the beam guiding unit and/or for controlling the moving unit for moving the object holder, at least one detector for detecting at least one of: interaction particles or interaction radiation which are generated when the particle beam impinges on the object, and at least one processor into which a computer program product as mentioned above is loaded. The interaction particles or the interaction radiation may be the particles and the radiation, respectively, as already mentioned above.

A further embodiment of the particle beam device according to invention additionally or alternatively comprises an electrostatic unit as the beam guiding unit. Another embodiment of the particle beam device according to invention additionally or alternatively comprises a magnetic unit as the beam guiding unit. Again, a further embodiment of the particle beam device according to the invention additionally or alternatively comprises an objective lens as the beam guiding unit.

In an embodiment of the particle beam device according to invention it is additionally or alternatively provided that the beam generator is a first beam generator for generating a first particle beam comprising first charged particles and wherein the beam guiding unit is a first beam guiding unit for guiding the first particle beam to the object. Moreover, the particle beam device may further comprise at least one second beam generator for generating a second particle beam comprising second charged particles and a second beam guiding unit for guiding the second particle beam to the object.

In a further embodiment of the particle beam device according to invention it is additionally or alternatively provided that the detector is a first detector and that the particle beam device comprises at least one second detector for detecting at least one of: interaction particles or interaction radiation which are generated when the particle beam impinges on the object. The interaction particles or the interaction radiation may be the particles and the radiation, respectively, as already mentioned above.

In an embodiment of the particle beam device according to invention it is additionally or alternatively provided that the particle beam device is at least one of the following: an electron beam device or an ion beam device. In particular, the particle beam device may be an electron beam device and an ion beam device.

BRIEF DESCRIPTION OF THE DRAWINGS

Embodiments of the invention described herein will be explained in more detail in the following text with reference to the figures, in which.

DETAILED DESCRIPTION OF VARIOUS EMBODIMENTS

Figure 1:
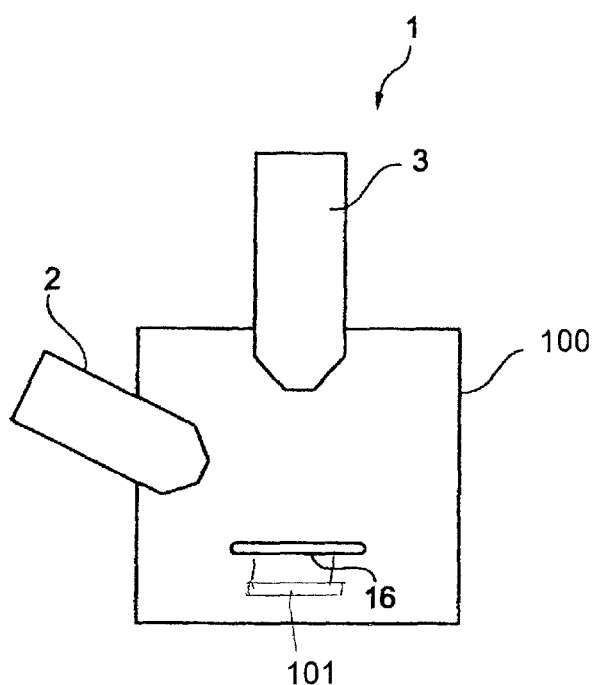
FIG. 1 is a schematic illustration of a first embodiment of a particle beam device.

FIG. 1 shows a schematic illustration of one embodiment of a particle beam device 1 according to the system described herein. The particle beam device 1 has a first particle beam column 2 in the form of an ion beam column, and a second particle beam column 3 in the form of an electron beam column. The first particle beam column 2 and the second particle beam column 3 are arranged on a sample chamber 100, in which a sample 16 to be analyzed and/or processed is arranged. It is explicitly noted that the system described herein is not restricted to the first particle beam column 2 being in the form of an ion beam column and the second particle beam column 3 being in the form of an electron beam column. In fact, the system described herein also provides for the first particle beam column 2 to be in the form of an electron beam column and for the second particle beam column 3 to be in the form of an ion beam column. A further embodiment of the system described herein provides for both the first particle beam column 2 and the second particle beam column 3 each to be in the form of an ion beam column.

Figure 2:
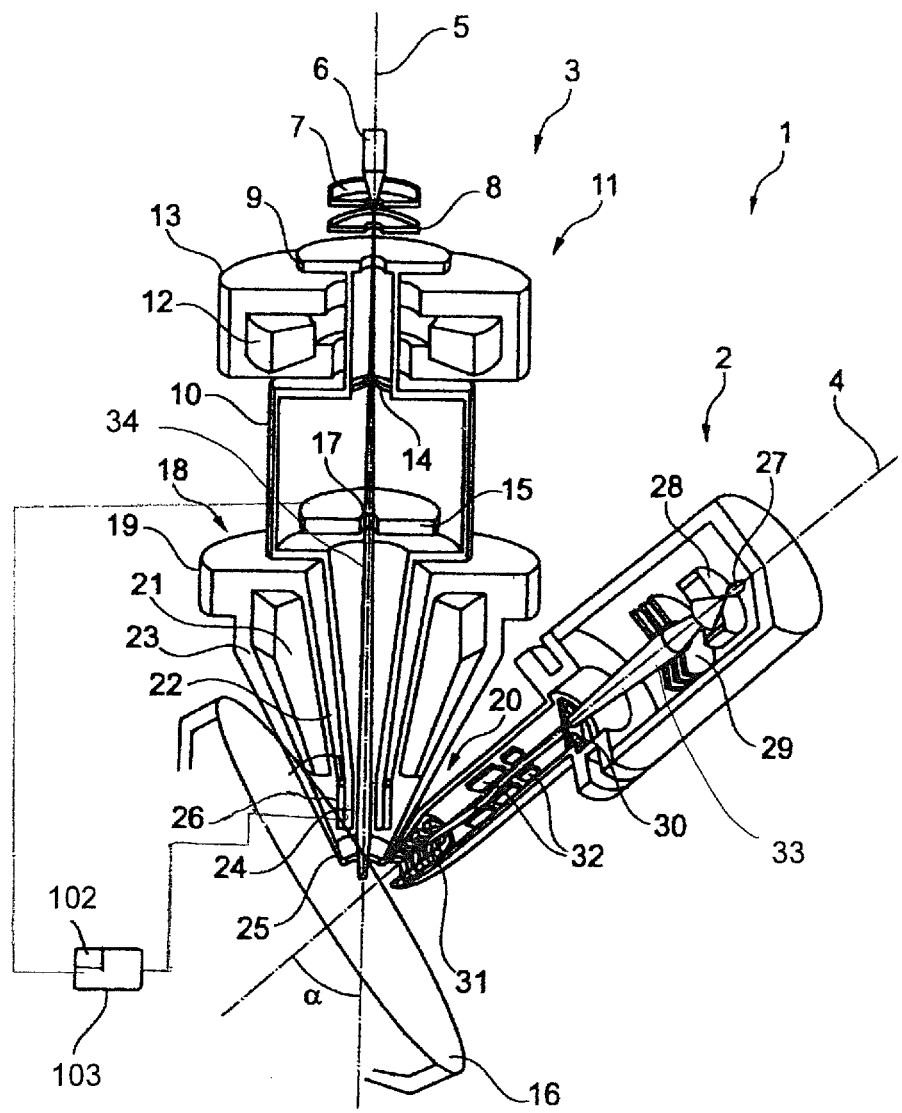
FIG. 2 is a further schematic illustration of the particle beam device according to FIG. 1.

FIG. 2 shows a detailed illustration of the particle beam device 1 shown in FIG. 1. For clarity reasons, the sample chamber 100 is not illustrated. The first particle beam column 2 in the form of the ion beam column has a first optical axis 4. Furthermore, the second particle beam column 3 in the form of the electron beam column has a second optical axis 5.

The second particle beam column 3, in the form of the electron beam column, will now be described first of all in the following text. The second particle beam column 3 has a second beam generator 6, a first electrode 7, a second electrode 8 and a third electrode 9. By way of example, the second beam generator 6 is a thermal field emitter. The first electrode 7 has the function of a suppressor electrode, while the second electrode 8 has the function of an extractor electrode. The third electrode 9 is an anode, and at the same time forms one end of a beam guide tube 10. A second particle beam 34 in the form of an electron beam is generated by the second beam generator 6. Electrons which emerge from the second beam generator 6 are accelerated to the anode potential, for example in the range from 1 kV to 30 kV, as a result of a potential difference between the second beam generator 6 and the third electrode 9. The second particle beam 34 in the form of the electron beam passes through the beam guide tube 10, and is focused onto the sample 16 to be analyzed and/or processed. This will be described in more detail further below.

The beam guide tube 10 passes through a collimator arrangement 11 which has a first annular coil 12 and a yoke 13. Seen in the direction of the sample 16, from the second beam generator 6, the collimator arrangement 11 is followed by a pinhole diaphragm 14 and a detector 15 with a central opening 17 arranged along the second optical axis 5 in the beam guide tube 10. The beam guide tube 10 then runs through a hole in a second objective lens 18. The second objective lens 18 is used for focusing the second particle beam 34 onto the sample 16. For this purpose, the second objective lens 18 has a magnetic lens 19 and an electrostatic lens 20. The magnetic lens 19 is provided with a second annular coil 21, an inner pole piece 22 and an outer pole piece 23. The electrostatic lens 20 comprises an end 24 of the beam guide tube 10 and a terminating electrode 25. The end 24 of the beam guide tube 10 and the terminating electrode 25 concurrently form an electrostatic deceleration device. The end 24 of the beam guide tube 10, together with the beam guide tube 10, is at the anode potential, while the terminating electrode 25 and the sample 16 are at a potential which is lower than the anode potential. This allows the electrons of the second particle beam 34 to be decelerated to a desired energy which is required for examination of the sample 16. The second particle beam column 3 furthermore has a raster device 26, by which the second particle beam 34 can be deflected and can be scanned in the form of a raster over the sample 16.

For imaging purposes, the detector 15 which is arranged in the beam guide tube 10 detects secondary electrons and/or backscattered electrons, which result from the interaction between the second particle beam 34 and the sample 16. The signals produced by the detector 15 are transmitted to an electronic unit 103.

The sample 16 is arranged on an object holder 101 in the form of a sample stage as shown in FIG. 1, by which the sample 16 is arranged such that it can move along three axes which are arranged to be mutually perpendicular (specifically an x-axis, a y-axis and a z-axis). Furthermore, the sample stage can be rotated about two rotation axes which are arranged to be mutually perpendicular. It is therefore possible to move the sample 16 to a desired position. The rotation of the object holder 101 about one of the two rotation axes may be used to tilt the object holder 101 such that the surface of the object 16 may be oriented perpendicular to the second particle beam 34 or the first particle beam 33 which will be described further below. Alternatively, the surface of the object 16 may be oriented in such a way that the surface of the object 16 and the first particle beam 33 or the second particle beam 34, respectively, comprise an angle, for example in the range of 0° to 90°.

As already mentioned above, the reference symbol 2 denotes the first particle beam column, in the form of the ion beam column. The first particle beam column 2 has a first beam generator 27 in the form of an ion source. The first beam generator 27 is used for generating a first particle beam 33 in the form of an ion beam. Furthermore, the first particle beam column 2 is provided with an extraction electrode 28 and a collimator 29. The collimator 29 is followed by a variable aperture 30 in the direction of the sample 16 along the first optical axis 4. The first particle beam 33 is focused onto the sample 16 by a first objective lens 31 in the form of focusing lenses. Raster electrodes 32 are provided, in order to scan the first particle beam 33 over the sample 16 in the form of a raster.

When the first particle beam 33 strikes the sample 16, the first particle beam 33 interacts with the material of the sample 16. In the process, interaction particles are generated, in particular secondary electrons and/or secondary ions. These are detected using the detector 15 or using at least one further detector (not illustrated) which is arranged in the sample chamber 100. Detection signals which are generated by the detector 15 or the further detector are provided to the electronic unit 103. The electronic unit 103 generates an image of the surface of the sample 16 and provides the generated image, for example, to a monitor (not illustrated). The first particle beam 33 may also be used to process the sample 16. For example, material may be deposited on the surface of the sample 16 using the first particle beam 33. Additionally or alternatively, structures may be etched into the sample 16 using the first particle beam 33.

The electronic unit 103 comprises a processor 102. A computer program product is loaded into the processor 102 and controls the particle beam device 1 in such way that a method according to the invention is carried out. This will be explained in detail further below.

Figure 3:
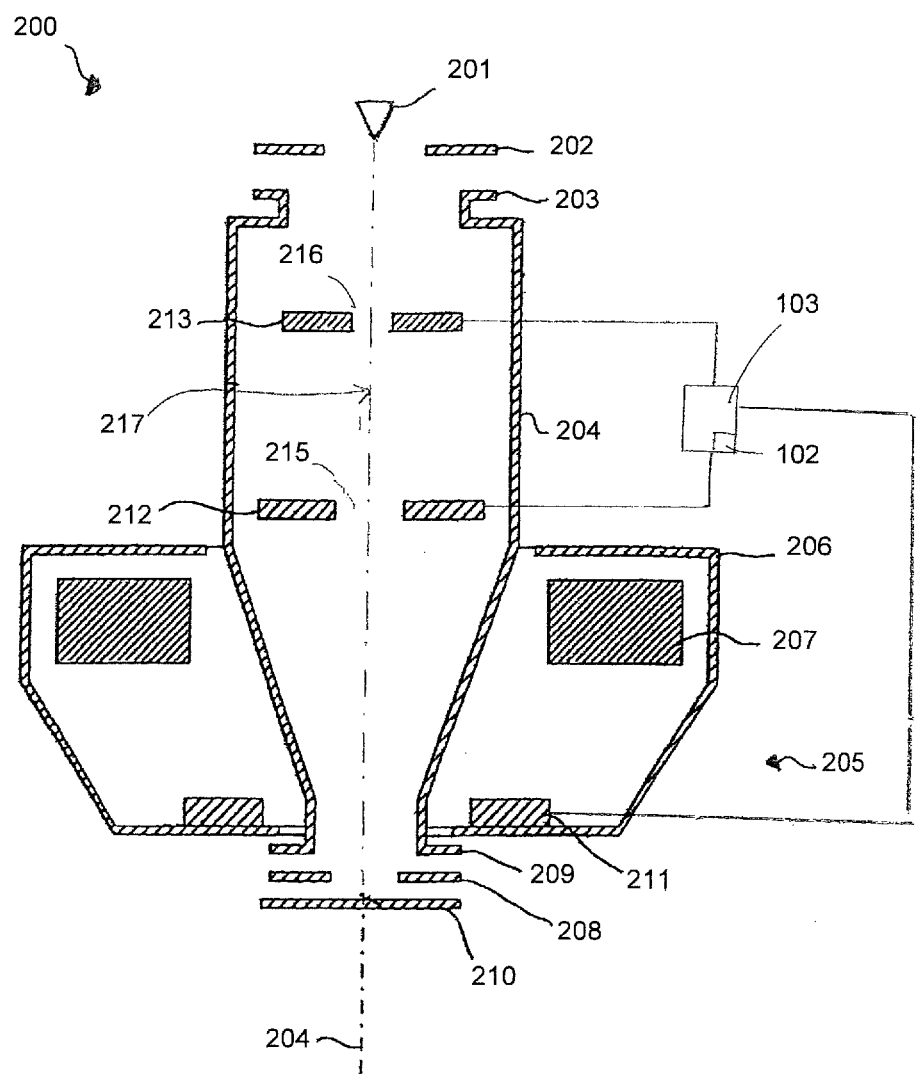
FIG. 3 is a schematic illustration of a second embodiment of a particle beam device.

FIG. 3 shows a schematic illustration of a further embodiment of a particle beam device which is denoted with reference sign 200. The particle beam device 200 is embodied as an electron beam device and, in principle, is a scanning electron microscope. However, reference is explicitly made here to the fact that the system described herein is not restricted to a scanning electron microscope. Rather, the system described herein can be used in any particle beam device, in particular in an ion beam device.

The particle beam device 200 has an optical axis 214, a beam generator in the form of an electron source 201 (cathode), an extraction electrode 202 and an anode 203, which at the same time forms one end of a beam guiding tube 204. By way of example, the electron source 201 may be a thermal field emitter. Electrons which emerge from the electron source 201 are accelerated by the anode 203 as a result of a potential difference between the electron source 201 and the anode 203. Accordingly, a particle beam 217 in the form of an electron beam is provided.

Furthermore, the particle beam device 200 has an objective lens 205. The objective lens 205 is provided with a bore, through which the beam guiding tube 204 is guided. Furthermore, the objective lens 205 has a pole piece 206, in which coils 207 are arranged.

Connected downstream of the beam guiding tube 204 is an electrostatic retardation apparatus. The latter comprises an individual electrode 208 and a tube electrode 209. The tube electrode 209 is applied to the end of the beam guiding tube 204 adjacent to an object holder 210. The object holder 210 is a movable sample stage having a sample receptacle (not illustrated), on which a sample can be arranged (not illustrated). The object holder 210 has movement elements which ensure movement of the object holder 210 in such a way that a region of interest (that is an area to be analyzed and/or processed) on the sample can be examined using the particle beam 217.

Together with the beam guiding tube 204, the tube electrode 209 is at the anode potential. By contrast, the individual electrode 208 and a sample arranged on the object holder 210 lie at a lower potential as compared to the anode potential. This is how the electrons of the particle beam 217 can be decelerated to a desired energy required for examining a sample arranged on the object holder 210. The particle beam device 200 also has a scanning device 211, by which the particle beam 217 can be deflected and scanned over the sample arranged on the object holder 210.

For imaging purposes, secondary electrons and/or backscattered electrons are detected using a first detector 212 and a second detector 213 arranged along the optical axis 214. The first detector 212 and the second detector 213 are arranged at a distance from each other. The first detector 212 comprises a first central opening 215. The second detector 213 comprises a second central opening 216. The optical axis 214 runs through the first central opening 215 and the second central opening 216. Secondary electrons and/or backscattered electrons which are generated as a result of the interaction of the particle beam 217 with the sample arranged on the object holder 210 are detected by the first detector 212 and the second detector 213. In particular, the first detector 212 is used for detecting secondary electrons, whereas the second detector 213 is used for detecting backscattered electrons. The second detector 213 might comprise a grid electrode (not illustrated) which is used for deflecting secondary electrons in such a way that only backscattered electrons are detected by the second detector 213. In a further embodiment of the particle beam device 200, the particle beam device 200 may comprise at least one further detector which may be arranged in the sample chamber (not illustrated). The further detector detects interaction particles and/or interaction radiation as already mentioned above. The signals generated by the first detector 212 and the second detector 213 and—if the further detector is arranged in the sample chamber—the signals generated by the further detector are transmitted to an electronic unit 103 for imaging purposes. The electronic unit 103 of this embodiment also comprises a processor 102. A computer program product is loaded into the processor 102 and controls the particle beam device 200 in such way that a method according to the invention is carried out. This will be explained in detail further below.

The object holders 101 and 210 will now be discussed in more detail with respect to FIGS. 4 and 5. The object holders 101 and 210 are identically built. Therefore, although the following discussion is directed to the object holder 101 only, the discussion also applies the object holder 210.

Figure 4:
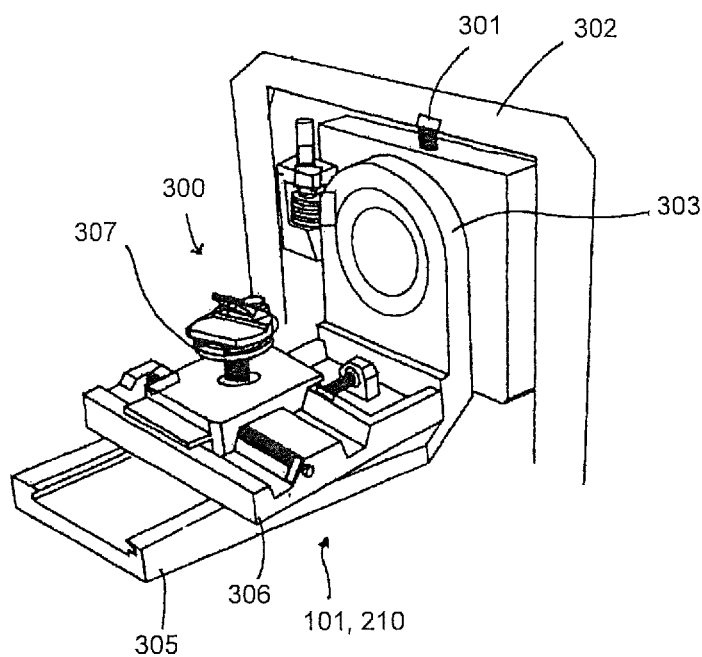
FIG. 4 is a schematic illustration of an object holder in the form of a sample stage.
Figure 5:
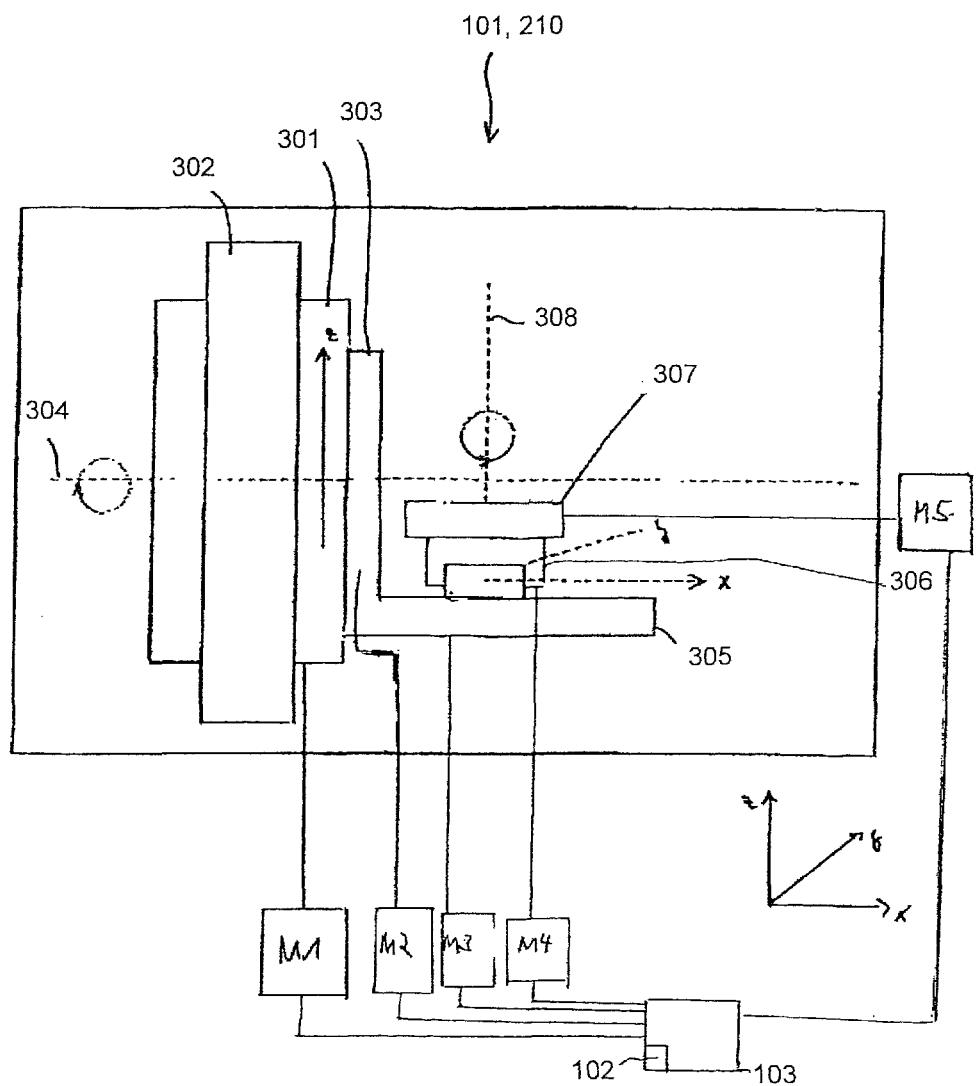
FIG. 5 is a further schematic illustration of the object holder according to FIG. 4.

The object holder 101 is a movable sample stage, which is illustrated schematically in FIGS. 4 and 5. Reference is already now made to the fact that the invention is not restricted to the object holder 101 described here. Rather, the invention can be provided for any embodiment of a movable carrier element.

The object holder 101 has a sample receptacle 300, on which the sample 16 is arranged. The object holder 101, embodied as a sample stage, has movement elements which ensure a movement of the object holder 101 in such a way that a an area of interest—which is also called a region of interest—on the sample 16 can be examined using the first particle beam 33 and/or the second particle beam 34. The movement elements are illustrated schematically in FIGS. 4 and 5 and will be explained below.

The object holder 101 has a first movement element 301 on a housing 302 of the sample chamber 100, in which the object holder 101 is arranged and which is connected to the particle beam device 1 (not illustrated). The first movement element 301 renders possible a movement of the object holder 101 along a z-axis which is also called a first translation axis. Furthermore, a second movement element 303 is provided. The second movement element 303 renders possible a rotation of the object holder 101 about a first rotation axis 304, which is also referred to as tilt-axis (first rotation axis). This second movement element 303 serves to tilt the sample 16 arranged in the sample receptacle 300 about the first rotation axis 304.

On the second movement element 303, in turn, a third movement element 305 is arranged, the latter being embodied as a guide for a carriage and ensuring that the object holder 101 can move in the x-direction which is a second translation axis. The aforementioned carriage in turn is a further movement element, namely a fourth movement element 306. The fourth movement element 306 is embodied in such a way that the object holder 101 can move in the y-direction which is a third translation axis. To this end, the fourth movement element 306 has a guide, in which a further carriage, carrying the sample receptacle 300, is guided. The sample receptacle 300 in turn is embodied with a fifth movement element 307, thanks to which the sample receptacle 300 is rotatable about a second rotation axis 308. The second rotation axis 308 is oriented perpendicular to the first rotation axis 304.

As a result of the above-described arrangement, the object holder 101 of the exemplary embodiment discussed here has the following kinematic chain: first movement element 301 (movement along the z-axis)—second movement element 303 (rotation about the first rotation axis 304)—third movement element 305 (movement along the x-axis)—fourth movement element 306 (movement along the y-axis)—fifth movement element 307 (rotation about the second rotation axis 308).

In a further exemplary embodiment (not illustrated here), further movement elements are provided such that movements are made possible along further translation axes and/or about further rotation axes.

As is evident from FIG. 5, each of the aforementioned movement elements 301, 303 and 305 to 307 is connected to a stepper motor. Thus, the first movement element 301 is connected to a first stepper motor M1 and is driven as a result of a driving force provided by the first stepper motor M1. The second movement element 303 is connected to a second stepper motor M2, which drives the second movement element 303. The third movement element 305 is in turn connected to a third stepper motor M3. The third stepper motor M3 provides a driving force for driving the third movement element 305. The fourth movement element 306 is connected to a fourth stepper motor M4, wherein the fourth stepper motor M4 drives the fourth movement element 306. Furthermore, the fifth movement element 307 is connected to a fifth stepper motor M5. The fifth stepper motor M5 provides a driving force, which drives the fifth movement element 307.

Figure 6:
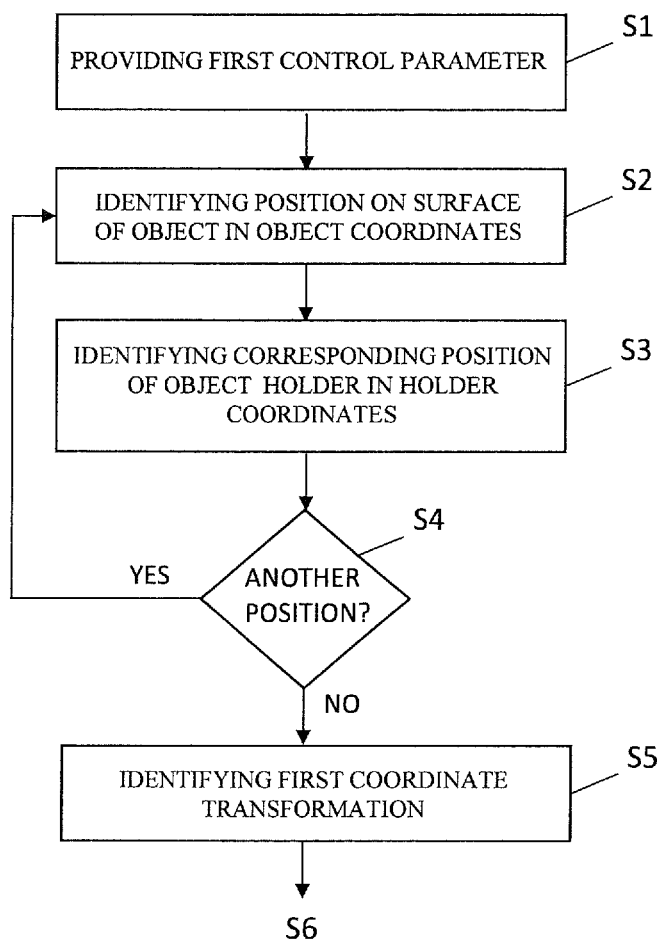
FIG. 6 is a schematic illustration of a first part of a flow chart of a method according to the invention.
Figure 7:
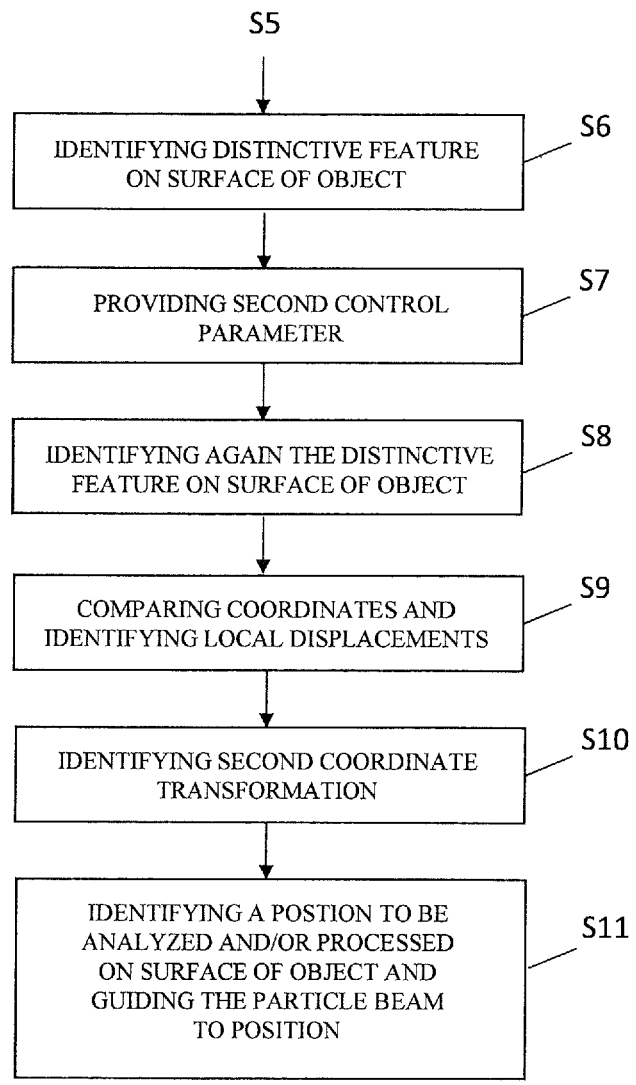
FIG. 7 is a schematic illustration of a second part of the flow chart of the method according to the invention.
Figure 8:
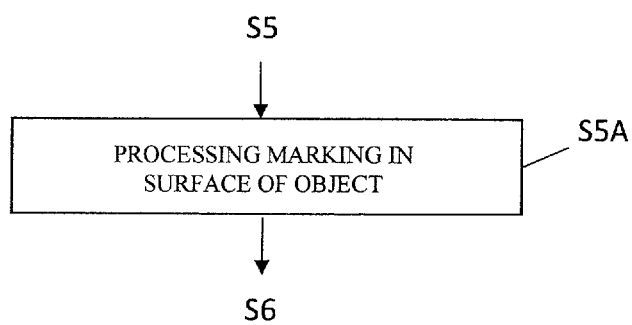
FIG. 8 is a schematic illustration of an additional step of a further embodiment of the method according to the invention.

FIGS. 6 to 8 show an embodiment of the method according to the invention which may be carried out in a particle beam device 1 according to FIG. 2 and in a particle beam device 200 according to FIG. 3.

FIG. 6 shows a first part of the method according to the invention. In a step S1, a first control parameter is provided by the electronic unit 103 such that the particle beam device 1 according to FIG. 2 or the particle beam device 200 according to FIG. 3 is operated in a first operation mode. For example, with respect to the embodiment shown in FIG. 2, the first objective lens 31, the second objective lens 18 and/or the raster device 26 are operated using specific excitations. For example, with respect to the embodiment shown in FIG. 3, the objective lens 205 and/or the scanning device 211 are operated using specific excitations. Additionally or alternatively, the first control parameter is provided by the electronic unit 103 in such a way that a specific first acceleration voltage for the particle beam is provided, for example in the range of 1 kV to 30 kV. In a further embodiment, the first control parameter is provided by the electronic unit 103 in such a way that a first beam current of the particle beam is given, for example in the range of 1 nA to 1 µA. Additionally or alternatively, the first control parameter may also be used for controlling the stepper motors M1 to M5 for moving the object holder 101 of the particle beam device 1 according to FIG. 2 or the object holder 210 of the particle beam device 200 according to FIG. 3 into a desired position. The desired position may be a first position which, in particular, may comprise a rotation of the object holder 101 of the particle beam device 1 according to FIG. 2 or of the object holder 210 of the particle beam device 200 according to FIG. 3 around the first rotational axis 304 such that the object holder 101 of the particle beam device 1 according to FIG. 2 or the object holder 210 of the particle beam device 200 according to FIG. 3 is in a first tilt position. Additionally or alternatively, the first control parameter may also be used to select which detector to use in the particle beam device 1 according to FIG. 2 or in the particle beam device 200 according to FIG. 3 for generating a desired image of the sample.

As mentioned above, step S1 provides for the particle beam device 1 according to FIG. 2 or the particle beam device 200 according to FIG. 3 to be operated in the first operation mode. In a step S2, a registration position on the surface of the object 16 is identified using object coordinates given in a first coordinate system in the form of the object coordinate system. The registration position can be a region of interest where the object 16 is to be analyzed or processed. The object coordinates of the registration position are determined, stored and made accessible for further calculations. In a step S3, the current position of the object holder 101 or 210, respectively, is identified using holder coordinates in a second coordinate system in the form of the holder coordinate system. Therefore, the position of the object holder 101 or 210, respectively, given in holder coordinates and which corresponds to the identified registration position on the surface of the object 16 is identified, i.e. determined, stored and made accessible for further calculations. Steps S2 and S3 may be repeated in step S4 if another registration position is to be identified. This might be advantageous in case of a rotation between the object coordinate system and the holder coordinate system. If the steps S2 and S3 are not repeated or no further repetition is desired, in step S5 a first coordinate transformation between the object coordinate system and the holder coordinate system is identified, i.e. determined, using the registration position(s) identified in steps S2 and S3 and given in object coordinates and holder coordinates. The first coordinate transformation describes the relation between the object coordinate system and the holder coordinate system. By using the first coordinate transformation, it is possible to calculate a position in holder coordinates corresponding to a position given in object coordinates and vice versa.

The identification of the registration position can be accomplished by a user interaction, for example in which the user sets a mark to an area in the image which he deems suitable for a registration position.

In step S6 as shown in FIG. 7, a position of a distinctive feature on the surface of the object 16 is identified, i.e. determined in this embodiment. The distinctive feature is chosen in such a way that it can easily be identified in an image obtained by the particle beam device 1 according to FIG. 2 or the particle beam device 200 according to FIG. 3. Moreover, the distinctive feature is chosen in such a way that it can be identified using any operation mode of the particle beam device 1 according to FIG. 2 or of the particle beam device 200 according to FIG. 3. In other words, the distinctive feature can be identified using different values of beam parameters used for adjusting the operation mode of the particle beam device 1 or of the particle beam device 200. For example, with respect to the particle beam device 1 comprising the first particle beam column 2 and the second particle beam column 3, the distinctive feature may be chosen in such a way that—when changing from a first operation mode using the first particle beam column 2 to a second operation mode using the second beam column 3 or vice versa—the distinctive feature may be identified in either one of the two operation modes. In contrast to the distinctive feature, a non-distinctive feature may not be identified when changing from the first operation mode to the second operation mode or vice versa since the contrast of the non-distinctive feature in the image of the object generated in the first operation mode and in the image of the object generated in the second operation mode may change such that the non-distinctive feature is visible in the first operation mode but not in the second operation mode. In a further embodiment of the invention it is alternatively or additionally provided that the distinctive feature may be identified even if the object holder 101 of the particle beam device 1 according to FIG. 2 or the object holder 210 of the particle beam device 200 according to FIG. 3 is tilted from a first position having a first tilt angle to a second position having a second tilt angle. For example, with respect to the particle beam device 1 according to FIGS. 1 and 2, the first position may be a position in which a surface plane of the sample 16 may be oriented perpendicular to the second optical axis 5 of the second particle beam column 3 as illustrated in FIG. 1, and the second position may be a position in which the surface plane of the sample 16 may be oriented perpendicular to the first optical axis 4 of the first particle beam column 2 as illustrated in FIG. 2.

The identification of the distinctive feature also can be accomplished by a user interaction, for example in which the user sets a mark to a feature in the image recorded in the first operation mode which feature he also could identify in the second operation mode. Alternatively, the distinctive feature can be identified by image analyses of the image recorded in the first operation mode provided that the distinctive feature is unique, does appear in the image once and only once.

In step S6, the coordinates of the distinctive feature in the object coordinate system are identified. In other words, first coordinates of the distinctive feature in the object coordinate system are identified, i.e. determined, stored and made accessible for further calculations.

If the surface of the sample 16 which is arranged in the particle beam device 1 according to FIG. 2 or in the particle beam device 200 according to FIG. 3 does not comprise a distinctive feature but only non-distinctive features, as described above, one embodiment of the invention comprises a step of generating such a distinctive feature. With respect to the particle beam device 1 according to FIG. 2, the distinctive feature may be generated by deposition or etching of a structure, in particular a three dimensional structure, on or into the surface of the sample 16 by using the first particle beam 33 and/or the second particle beam 34. With respect to the particle beam device 200 according to FIG. 3, the distinctive feature may be generated by deposition or etching of a structure, in particular a three dimensional structure, on or into the surface of the sample using the particle beam 217. This additional step 5A of the embodiment of the method according to the invention is shown in FIG. 8. For example, a marking is generated by processing the marking on or into the surface of the sample 16, for example by using the ion beam and/or a laser beam in step S5A which is carried out after step S5. The marking may be a cross-like marking or any other distinctive feature which may be processed on or into the surface of the sample 16. After step 5A has been carried out, the method continues with step S6, as mentioned above. In one embodiment of the method according to the invention it is additionally or alternatively provided that the step 5A is carried out even though a distinctive feature is already given on the surface of the sample 16.

In a step S7, the first operation mode of the particle beam device 1 according to FIG. 2 or of the particle beam device 200 according to FIG. 3 is changed to a second operation mode. A second control parameter is provided by the electronic unit 103 such that the particle beam device 1 according to FIG. 2 or the particle beam device 200 according to FIG. 3 is operated in the second operation mode. For example, with respect to the embodiment shown in FIG. 2, the first objective lens 31, the second objective lens 18, the collimator arrangement 11 and/or the collimator 29 are operated using different specific excitations in comparison to the first operation mode. For example, with respect to the embodiment shown in FIG. 3, the objective lens 205 is operated using different specific excitations in comparison to the first operation mode. Additionally or alternatively, the second control parameter is provided by the electronic unit 103 in such a way that a specific second acceleration voltage for the particle beam is provided, for example in the range of 1 kV to 30 kV. In a further embodiment, the second control parameter is provided by the electronic unit 103 in such a way that a second beam current of the particle beam 33, 34 with respect to FIG. 2 or of the particle beam 217 with respect to FIG. 3 different to the first beam current is given, for example in the range of 1 nA to 1 µA. Additionally or alternatively, with respect to the particle beam device 1 according to FIG. 2, the second control parameter is provided by the electronic unit 103 in such a way that the particle beam device 1 changes its operation mode with respect to the use of the respective particle beam columns 2 and 3. If the particle beam device 1 is operated using the first particle beam column 2 providing the first particle beam 33 in the form of the ion beam, the operation mode of particle beam device 1 is changed such that the second particle beam column 3 providing the second particle beam 34 in the form of the electron beam is used instead. Alternatively, if the particle beam device 1 is operated using the second particle beam column 3 providing the second particle beam 34 in the form of the electron beam, the operation mode of particle beam device 1 is changed such that the first particle beam column 2 providing the first particle beam 33 in the form of the ion beam is used instead. Additionally or alternatively, the second control parameter may also be used for controlling the stepper motors M1 to M5 for moving the object holder 101 of the particle beam device 1 according to FIG. 2 or the object holder 210 of the particle beam device 200 according to FIG. 3 into a desired position. The desired position may be a position which, in particular, may comprise a rotation of the object holder 101 of the particle beam device 1 according to FIG. 2 or of the object holder 210 of the particle beam device 200 according to FIG. 3 around the first rotational axis 304 such that the object holder 101 of the particle beam device 1 according to FIG. 2 or the object holder 210 of the particle beam device 200 according to FIG. 3 is in a specific tilt position. For example, the object holder 101 of the particle beam device 1 according to FIG. 2 or the object holder 210 of the particle beam device 200 according to FIG. 3 is tilted from a first specific position having a first tilt angle to a second specific position having a second tilt angle. In particular, with respect to the particle beam device 1 according to FIGS. 1 and 2, the first specific position may be a position in which the surface plane of the sample 16 may be oriented perpendicular to the second optical axis 5 of the second particle beam column 3 as illustrated in FIG. 1, and the second specific position may be a position in which the surface plane of the sample 16 may be oriented perpendicular to the first optical axis 4 of the first particle beam column 2 as illustrated in FIG. 2. Additionally or alternatively, the second control parameter may also be used to select which detector is used in the particle beam device 1 according to FIG. 2 or in the particle beam device 200 according to FIG. 3 for generating a desired image of the sample 16. Additionally or alternatively the second control parameter is provided by the electronic unit 103 in such a way that operation settings of the detector are changed from a first operation setting to a second operation setting, wherein each operation setting controls and influences in particular the detection characteristics of the detector, for example the amplification or the collection characteristic of the detector.

After providing the second control parameter in step S7, the distinctive feature is identified in step S8 again. In particular, second coordinates of the distinctive feature in the object coordinate system are identified, i.e. determined, stored and made accessible for further calculations, after transferring the particle beam device 1 or the particle beam device 200 into the second operation mode.

In step S9, the first coordinates of the distinctive feature obtained in the first operation mode are compared with the second coordinates of the distinctive feature obtained in the second operation mode. A local displacement of the first coordinates to the second coordinates is identified, i.e. determined, stored and made accessible for further calculations, if the first coordinates are not identical with the second coordinates.

In step S10, a second coordinate transformation using the first coordinate transformation and the local displacement is identified, i.e. determined, stored and made accessible for further calculations. In other words, step S10 provides the second coordinate transformation which describes the relation between the first coordinate system and the second coordinate system considering the local displacement which might occur using different beam parameters for operating the particle beam device 1 or 200.

In step S11, a position of an area to be analyzed and/or processed on the surface of the sample 16 is identified, i.e. determined, by using the second coordinate transformation determined in step S10. The particle beam is guided to this position of an area to be analyzed and/or processed. Additionally or alternatively, the object holder 101 or 210 is moved to this position. The step of analyzing may comprise the step of imaging the sample 16 at this position.

If the registration position identified in step S2 form a region of interest, i.e is a region which is to be processed and/or analyzed in the second operation mode, the coordinates of this registration position is transformed in step S11 into coordinates in the second operation mode by using the second coordinate transformation and the charged particle beam is guided to a position on the object surface which corresponds to the transformed coordinates of this registration position.

However, it is also possible that the region of interest, which is to be processed and/or analyzed in the second operation mode, is defined in a different way. For example the region of interest can have been defined in a preceding analyzing step with a different analyzing system, for example an optical microscope, an x-ray microscope or an x-ray tomography system. In this case, the coordinates of the region of interest can be defined and given in the object coordinate system. Based on the second coordinate transformation, the charged particle beam then is guided to a position of the object surface which corresponds to these coordinates of the region of interest in the object coordinate system.

The method according to the invention allows for analyzing and/or processing an area of the sample 16 even if a local displacement of this area in the image occurs due to the use of different beam parameters, as described above. The method according to the invention avoids that a wrong area or position is analyzed and/or processed. Moreover, the method allows that the particle beam is guided to the identified area or position to be analyzed and/processed even if this area or position cannot be seen in an image when using the second operation mode.

The method according to the invention may also be carried out in an automated process. In other words, the electronic unit 103 controls the particle beam device 1 according to FIG. 2 or the particle beam device 200 according to FIG. 3 using an automated process such that manually provided control signals are not necessary. Once the distinctive feature and its position have been identified, the method allows to follow the distinctive feature during the imaging and to repeat the method if necessary, that means if a further local displacement occurs.

Various embodiments discussed herein may be combined with each other in appropriate combinations in connection with the system described herein. Additionally, in some instances, the order of steps in the flow diagrams, flowcharts and/or described flow processing may be modified, where appropriate. Further, various aspects of the system described herein may be implemented using software, hardware, a combination of software and hardware and/or other computer-implemented modules or devices having the described features and performing the described functions. The system may further include a display and/or other computer components for providing a suitable interface with a user and/or with other computers.

Software implementations of aspects of the system described herein may include executable code that is stored in a computer-readable medium and executed by one or more processors. The computer-readable medium may include volatile memory and/or non-volatile memory, and may include, for example, a computer hard drive, ROM, RAM, flash memory, portable computer storage media such as a CD-ROM, a DVD-ROM, an SD card, a flash drive or other drive with, for example, a universal serial bus (USB) interface, and/or any other appropriate tangible or non-transitory computer-readable medium or computer memory on which executable code may be stored and executed by a processor. The system described herein may be used in connection with any appropriate operating system.

Other embodiments of the invention will be apparent to those skilled in the art from a consideration of the specification and/or an attempt to put into practice the invention disclosed herein. It is intended that the specification and examples be considered as exemplary only, with the true scope and spirit of the invention being indicated by the following claims.

The invention claimed is:

1. A method for analyzing and/or processing an object using a particle beam device, wherein the particle beam device comprises at least one movable object holder for arranging the object in the particle beam device, at least one moving unit for moving the object holder, a first beam column operated in a first operation mode and comprising a first beam generator for generating a first particle beam comprising first charged particles, a second beam column operated in a second operation mode and comprising a second beam generator for generating a second particle beam comprising second charged particles, the second operation mode being different than the first operation mode, at least one beam guiding unit for guiding the first particle beam and the second particle beam to the object, at least one control unit for controlling the beam guiding unit and/or for controlling the moving unit for moving the object holder, and at least one detector for detecting at least one of: interaction particles or interaction radiation which are generated when the first or second particle beam impinges on the object, the method comprising:

the control unit providing a first control parameter, wherein the beam guiding unit is controlled using the first control parameter for guiding the first particle beam and wherein in the first operation mode, only the first particle beam and the first control parameter are used;

identifying object coordinates of at least one registration position on a surface of the object in a first coordinate system;

correlating a position of the object holder in a second coordinate system to the registration position on the surface of the object, wherein the position of the object holder is given by holder coordinates in the second coordinate system;

identifying a first coordinate transformation between the first coordinate system and the second coordinate system using the coordinates of the registration position and the holder coordinates of the position of the object holder;

identifying a distinctive feature on the surface of the object and identifying first coordinates of the distinctive feature in the first coordinate system;

the control unit providing a second control parameter, wherein the second control parameter is used for controlling the beam guiding unit for guiding the second particle beam and wherein in the second operation mode, only the second particle beam and the second control parameter are used;

identifying again the distinctive feature after the control unit has provided the second control parameter and identifying second coordinates of the distinctive feature in the first coordinate system;

comparing the first coordinates with the second coordinates;

identifying a local displacement of the first coordinates to the second coordinates, identifying a second coordinate transformation using the first coordinate transformation and the local displacement, wherein the second coordinate transformation allows for any local displacement in an area to be analyzed and/or processed on the surface of the object;

identifying a position of the area to be analyzed and/or processed on the surface of the object by using the second coordinate transformation; and at least one of: guiding the first or second particle beam or moving the object holder using the moving unit to the position of the area to be analyzed and/or processed.

2. The method according to claim 1, wherein a first marking on the surface of the object is used as the distinctive feature.

3. The method according to claim 2, wherein the first marking is processed in the surface of the object before identifying the object coordinates.

4. The method according to claim 1, wherein the distinctive feature comprises two or more distinctive features or an extended distinctive feature.

5. The method according to claim 4, wherein two or more markings or an extended marking is/are processed in the surface of the object before identifying the object coordinates.

6. The method according to claim 1, further comprising at least one of:
(i) an object coordinate system is used as the first coordinate system; or
(ii) an object holder coordinate system is used as the second coordinate system.

7. A method for analyzing and/or processing an object using a particle beam device, wherein the particle beam device comprises at least one movable object holder for arranging the object in the particle beam device, at least one moving unit for moving the object holder, at least one beam generator for generating a particle beam comprising charged particles, at least one beam guiding unit for guiding the particle beam to the object, at least one control unit for controlling the beam guiding unit and/or for controlling the moving unit for moving the object holder, and at least one detector for detecting at least one of: interaction particles or interaction radiation which are generated when the particle beam impinges on the object, the method comprising:

the control unit providing a first control parameter, wherein at least one of the following is provided:
(i) the beam guiding unit is controlled using the first control parameter for guiding the particle beam, or
(ii) the moving unit is controlled using the first control parameter for moving the object holder;

identifying object coordinates of at least one registration position on a surface of the object in a first coordinate system;

correlating a position of the object holder in a second coordinate system to the registration position on the surface of the object, wherein the position of the object holder is given by holder coordinates in the second coordinate system;

identifying a first coordinate transformation between the first coordinate system and the second coordinate system using the coordinates of the registration position and the holder coordinates of the position of the object holder;

identifying a distinctive feature on the surface of the object and identifying first coordinates of the distinctive feature in the first coordinate system;

the control unit providing a second control parameter, wherein the second control parameter is used for at least one of: controlling the beam guiding unit for guiding the particle beam, controlling the moving unit for moving the object holder or controlling the detector;

identifying again the distinctive feature after the control unit has provided the second control parameter and identifying second coordinates of the distinctive feature in the first coordinate system;

comparing the first coordinates with the second coordinates;

identifying a local displacement of the first coordinates to the second coordinates, identifying a second coordinate transformation using the first coordinate transformation and the local displacement;

identifying a position of an area to be analyzed and/or processed on the surface of the object by using the second coordinate transformation; and at least one of: guiding the particle beam or moving the object holder using the moving unit to the position of the area to be analyzed and/or processed, wherein the first control parameter is chosen in such a way that the control unit controls at least one of:
(i) providing a first excitation to the beam guiding unit;
(ii) providing a first landing energy of the particle beam; or
(iii) adjusting a first beam current of the particle beam.

8. The method according to claim 7, wherein the second control parameter is chosen in such a way that the control unit controls at least one of:
(i) providing a second excitation to the beam guiding unit;
(ii) providing a second landing energy of the particle beam; or
(iii) adjusting a second beam current of the particle beam,
and wherein at least one of: the second excitation, the second landing energy or the second beam current differs from at least one of the first excitation, the first landing energy or the first beam current.

9. The method according to claim 1, the beam guiding unit being a first beam guiding unit for guiding the first particle beam to the object, wherein the second beam column comprises at least one second beam guiding unit for guiding the second particle beam to the object, the method further comprising:

operating the particle beam device using the first beam column or the second beam column.

10. The method according to claim 1, wherein the detector is a first detector, wherein the particle beam device further comprises at least one second detector for detecting at least one of: interaction particles or interaction radiation which are generated when the first or second particle beam impinges on the object, the method further comprising:

operating the particle beam device using the first detector or the second detector.

11. A non-transitory computer-readable medium storing software that, when executed by at least one processor, controls a particle beam device, wherein the particle beam device comprises at least one movable object holder for arranging the object in the particle beam device, at least one moving unit for moving the object holder, a first beam column operated in a first operation mode and comprising a first beam generator for generating a first particle beam comprising first charged particles, a second beam column operated in a second operation mode and comprising a second beam generator for generating a second particle beam comprising second charged particles, the second operation mode being different than the first operation mode, at least one beam guiding unit for guiding the first particle beam and the second particle beam to the object, at least one control unit for controlling the beam guiding unit and/or for controlling the moving unit for moving the object holder, and at least one detector for detecting at least one of: interaction particles or interaction radiation which are generated when the first or second particle beam impinges on the object, the software comprising:

executable code that provides a first control parameter, wherein the beam guiding unit is controlled using the first control parameter for guiding the first particle beam and wherein in the first operation mode, only the first particle beam and the first control parameter are used;

executable code that identifies object coordinates of at least one registration position on a surface of the object in a first coordinate system;

executable code that correlates a position of the object holder in a second coordinate system to the registration position on the surface of the object, wherein the position of the object holder is given by holder coordinates in the second coordinate system;

executable code that identifies a first coordinate transformation between the first coordinate system and the second coordinate system using the coordinates of the registration position and the holder coordinates of the position of the object holder;

executable code that identifies a distinctive feature on the surface of the object and identifying first coordinates of the distinctive feature in the first coordinate system;

executable code that provides a second control parameter, wherein the second control parameter is used for controlling the beam guiding unit for guiding the second particle beam and wherein in the second operation mode, only the second particle beam and the second control parameter are used;

executable code that identifies again the distinctive feature after the control unit has provided the second control parameter and identifying second coordinates of the distinctive feature in the first coordinate system;

executable code that compares the first coordinates with the second coordinates;

executable code that identifies a local displacement of the first coordinates to the second coordinates;

executable code that identifies a second coordinate transformation using the first coordinate transformation and the local displacement, wherein the second coordinate transformation allows for any local displacement in an area to be analyzed and/or processed on the surface of the object;

executable code that identifies a position of the area to be analyzed and/or processed on the surface of the object by using the second coordinate transformation; and executable code that performs at least one of: guiding the first or second particle beam or moving the object holder using the moving unit to the position of the area to be analyzed and/or processed.

12. The non-transitory computer-readable medium according to claim 11, wherein a first marking on the surface of the object is used as the distinctive feature.

13. The non-transitory computer-readable medium according to claim 12, wherein the first marking is processed in the surface of the object before identifying the object coordinates.

14. The non-transitory computer-readable medium according to claim 11, wherein the distinctive feature comprises two or more distinctive features or an extended distinctive feature.

15. The non-transitory computer-readable medium according to claim 14, wherein two or more markings or an extended marking is/are processed in the surface of the object before identifying the object coordinates.

16. The non-transitory computer-readable medium according to claim 11, further comprising at least one of:
(i) an object coordinate system is used as the first coordinate system; or
(ii) an object holder coordinate system is used as the second coordinate system.

17. A non-transitory computer-readable medium storing software that, when executed by at least one processor, controls a particle beam device, wherein the particle beam device comprises at least one movable object holder for arranging the object in the particle beam device, at least one moving unit for moving the object holder, at least one beam generator for generating a particle beam comprising charged particles, at least one beam guiding unit for guiding the particle beam to the object, at least one control unit for controlling the beam guiding unit and/or for controlling the moving unit for moving the object holder, and at least one detector for detecting at least one of: interaction particles or interaction radiation which are generated when the particle beam impinges on the object, the software comprising:

executable code that provides a first control parameter, wherein at least one of the following is provided:
(i) the beam guiding unit is controlled using the first control parameter for guiding the particle beam, or
(ii) the moving unit is controlled using the first control parameter for moving the object holder;

executable code that identifies object coordinates of at least one registration position on a surface of the object in a first coordinate system;

executable code that correlates a position of the object holder in a second coordinate system to the registration position on the surface of the object, wherein the position of the object holder is given by holder coordinates in the second coordinate system;

executable code that identifies a first coordinate transformation between the first coordinate system and the second coordinate system using the coordinates of the registration position and the holder coordinates of the position of the object holder;

executable code that identifies a distinctive feature on the surface of the object and identifying first coordinates of the distinctive feature in the first coordinate system;

executable code that provides a second control parameter, wherein the second control parameter is used for at least one of: controlling the beam guiding unit for guiding the particle beam, controlling the moving unit for moving the object holder or controlling the detector;

executable code that identifies again the distinctive feature after the control unit has provided the second control parameter and identifying second coordinates of the distinctive feature in the first coordinate system;

executable code that compares the first coordinates with the second coordinates;

executable code that identifies a local displacement of the first coordinates to the second coordinates;

executable code that identifies a second coordinate transformation using the first coordinate transformation and the local displacement;

executable code that identifies a position of an area to be analyzed and/or processed on the surface of the object by using the second coordinate transformation; and executable code that performs at least one of: guiding the particle beam or moving the object holder using the moving unit to the position of the area to be analyzed and/or processed, wherein the first control parameter is chosen in such a way that the control unit controls at least one of:

(i) providing a first excitation to the beam guiding unit;
(ii) providing a first landing energy of the particle beam; or
(iii) adjusting a first beam current of the particle beam.

18. The non-transitory computer-readable medium according to claim 17, wherein the second control parameter is chosen in such a way that the control unit controls at least one of:

(i) providing a second excitation to the beam guiding unit;
(ii) providing a second landing energy of the particle beam; or
(iii) adjusting a second beam current of the particle beam, and wherein at least one of: the second excitation, the second landing energy or the second beam current differs from at least one of the first excitation, the first landing energy or the first beam current.

19. The non-transitory computer-readable medium according to claim 11, wherein the first beam column comprises the beam guiding unit being a first beam guiding unit for guiding the first particle beam to the object, wherein the second beam column comprises at least one second beam guiding unit for guiding the second particle beam to the object, the software further comprising:

executable code that operates the particle beam device using the first beam column or the second beam column.

20. The non-transitory computer-readable medium according to claim 11, wherein the detector is a first detector, wherein the particle beam device further comprises at least one second detector for detecting at least one of: interaction particles or interaction radiation which are generated when the first or second particle beam impinges on the object, the method further comprising:

operating the particle beam device using the first detector or the second detector.

21. A particle beam device, comprising
at least one movable object holder for arranging the object in the particle beam device;
at least one moving unit for moving the object holder;
a first beam column operated in a first operation mode comprising a first beam generator for generating a first particle beam comprising first charged particles;
a second beam column operated in a second operation mode comprising a second beam generator for generating a second particle beam comprising second charged particles, the second operation mode being different from the first operation mode;
at least one beam guiding unit for guiding the first particle beam and the second particle beam to the object;
at least one control unit for controlling the beam guiding unit and/or for controlling the moving unit for moving the object holder;
at least one detector for detecting at least one of: interaction particles or interaction radiation which are generated when the first or second particle beam impinges on the object; and
a computer-readable medium storing software that, when executed by at least one processor, controls the particle beam device, the software comprising:

executable code that provides a first control parameter, wherein the beam guiding unit is controlled using the first control parameter for guiding the first particle beam and wherein in the first operation mode, only the first particle beam and the first control parameter are used;

executable code that identifies object coordinates of at least one registration position on a surface of the object in a first coordinate system;

executable code that correlates a position of the object holder in a second coordinate system to the registration position on the surface of the object, wherein the position of the object holder is given by holder coordinates in the second coordinate system;

executable code that identifies a first coordinate transformation between the first coordinate system and the second coordinate system using the coordinates of the registration position and the holder coordinates of the position of the object holder;

executable code that identifies a distinctive feature on the surface of the object and identifying first coordinates of the distinctive feature in the first coordinate system;

executable code that provides a second control parameter, wherein the second control parameter is used for controlling the beam guiding unit for guiding the second particle beam and wherein in the second operation mode, only the second particle beam and the second control parameter are used;

executable code that identifies again the distinctive feature after the control unit has provided the second control parameter and identifying second coordinates of the distinctive feature in the first coordinate system;

executable code that compares the first coordinates with the second coordinates;

executable code that identifies a local displacement of the first coordinates to the second coordinates;

executable code that identifies a second coordinate transformation using the first coordinate transformation and the local displacement, wherein the second coordinate transformation allows for any local displacement in an area to be analyzed and/or processed on the surface of the object;

executable code that identifies a position of the area to be analyzed and/or processed on the surface of the object by using the second coordinate transformation; and executable code that performs at least one of: guiding the first or second particle beam or moving the object holder using the moving unit to the position of the area to be analyzed and/or processed.

22. The particle beam device according to claim 21, further comprising at least one of the following features:
(i) the beam guiding unit is an electrostatic unit;
(ii) the beam guiding unit is a magnetic unit; or
(iii) the beam guiding unit is an objective lens.

23. The particle beam device according to claim 21, wherein the beam guiding unit is a first beam guiding unit for guiding the first particle beam to the object, the particle beam device further comprising:

at least one second beam guiding unit for guiding the second particle beam to the object.

24. The particle beam device according to claim 21, wherein the detector is a first detector, the particle beam device further comprising:

at least one second detector for detecting at least one of: interaction particles or interaction radiation which are generated when the first or second particle beam impinges on the object.

25. The particle beam device according to claim 21, wherein the particle beam device is at least one of the following: an electron beam device or an ion beam device.

26. The method according to claim 1, wherein the distinctive feature is identified when the object holder is turned from a first position having a first tilt angle to a second position having a second tilt angle different from the first tilt angle.

27. The non-transitory computer-readable medium according to claim 11, wherein the distinctive feature is identified when the object holder is turned from a first position having a first tilt angle to a second position having a second tilt angle different from the first tilt angle.

28. The particle beam device according to claim 21, wherein the distinctive feature is identified when the object holder is turned from a first position having a first tilt angle to a second position having a second tilt angle different from the first tilt angle.

* * * * *